United States Patent [19]
Brunelli et al.

[11] Patent Number: 6,054,015
[45] Date of Patent: Apr. 25, 2000

[54] APPARATUS FOR LOADING AND UNLOADING SUBSTRATES TO A CHEMICAL-MECHANICAL PLANARIZATION MACHINE

[75] Inventors: Thad Brunelli, Boise; Gina Garrison, Meridian; Wade Van Buren, Boise, all of Id.

[73] Assignee: Micron Technology, Inc., Boise, Id.

[21] Appl. No.: 09/018,921

[22] Filed: Feb. 5, 1998

[51] Int. Cl.[7] ...................................................... B24B 7/00
[52] U.S. Cl. .......................................... 156/345; 451/285
[58] Field of Search .............................. 156/345; 451/41, 451/285, 286, 287

[56] References Cited

U.S. PATENT DOCUMENTS 5,702,292  12/1997  Brunelli et al. ............................. 451/41
5,830,806  11/1998  Hudson et al. ......................... 451/41 X

*Primary Examiner*—Robert Dawson
*Assistant Examiner*—Jeffrey B. Robertson
*Attorney, Agent, or Firm*—Dorsey & Whitney LLP

[57] ABSTRACT

A planarizing machine and a method for reducing the number of residual particles on wafers and other substrates after CMP processing. In one embodiment, the planarizing machine has a platen mounted to a support structure, a polishing pad positioned on the platen, and a wafer carrier with a chuck. The polishing pad has a planarizing surface facing away from the platen, and the wafer carrier assembly is adapted to hold the backside of the wafer in the chuck and engage the front face of the wafer with the planarizing surface of the polishing pad. The planarizing machine also has a wafer loading assembly with a pedestal upon which the wafer is placed to load and unload the wafer to the chuck. The pedestal is preferably connected to an actuator that raises and lowers the pedestal with respect to the wafer carrier assembly. A particle barrier film is positioned in the chuck to engage the backside of the wafer and/or on the pedestal to engage the front face of the wafer. The particle barrier film is preferably a substantially non-porous film that does not entrap residual particles. Thus, substantially all of the residual particles are readily removed from the particle barrier film by a wash fluid to reduce the number of residual particles on surfaces of the CMP machine.

12 Claims, 3 Drawing Sheets

APPARATUS FOR LOADING AND UNLOADING SUBSTRATES TO A CHEMICAL-MECHANICAL PLANARIZATION MACHINE

TECHNICAL FIELD

The present invention relates to chemical-mechanical planarization of semiconductor wafers, and more particularly, to an apparatus and method for loading and unloading semiconductor wafers to a chemical-mechanical planarization machine.

BACKGROUND OF THE INVENTION

Chemical-mechanical planarization ("CMP") processes remove material from the surface of a semiconductor wafer in the production of integrated circuits. FIG. 1 schematically illustrates a CMP machine 10 with a wafer loading/unloading assembly 14, a platen 20, a wafer carrier assembly 30, a polishing pad 40, and a planarizing liquid 44 on the polishing pad 40. The polishing pad 40 may be a conventional polishing pad made from a continuous phase matrix material (e.g., polyurethane), or it may be a new generation fixed abrasive polishing pad made from abrasive particles fixedly dispersed in a suspension medium. The planarizing liquid 44 may be a conventional CMP slurry with abrasive particles and chemicals that remove material from the wafer, or the planarizing liquid 44 may be a planarizing solution without abrasive particles. In most CMP applications, conventional CMP slurries are used on conventional polishing pads, and planarizing solutions without abrasive particles are used on fixed abrasive polishing pads.

The CMP machine 10 also has an underpad 25 attached to an upper surface 22 of the platen 20 and the lower surface of the polishing pad 40. A drive assembly 26 rotates the platen 20 (indicated by arrow A) or the drive assembly 26 reciprocates the platen back and forth (indicated by arrow B). Since the polishing pad 40 is attached to the underpad 25, the polishing pad 40 moves with the platen 20.

The wafer carrier assembly 30 has a chuck 31 with a lower surface 32 to which the backside 15 of a wafer 12 may be attached. The wafer 12 may alternatively be attached to a resilient pad 34 positioned between the wafer 12 and the lower surface 32 of the chuck 31. The chuck 31 may be a weighted, free-floating chuck, or an actuator assembly 36 may be attached to the chuck 31 to impart axial and/or rotational motion (indicated by arrows C and D, respectively).

To planarize the wafer 12 with the CMP machine 10, a robotic device (not shown) places the front face 14 of the wafer 12 on a loading/unloading pedestal 50, and the wafer carrier assembly 30 moves the chuck 31 over the backside 15 of the wafer 12. The chuck 31 picks up the wafer 12 and then presses the front face 14 of the wafer 12 against the polishing pad 40. At least one of the platen 20 or the chuck 31 moves relative to the other to planarize the front face 14 of the wafer 12. After the wafer 12 is planarized to a desired endpoint, it is removed from the polishing pad 40, placed on the pedestal 50, disconnected from the chuck 31, and then removed from the pedestal 50 and transported to other processing stations.

One problem with conventional CMP processes is that residual particles from the slurry or the polishing pad remain on the front face of wafers after they have been planarized. The residual particles cause defects on the wafers that adversely affect subsequent semiconductor manufacturing processes and reduce the yield of usable wafers. Thus, to increase the yield, it would be desirable to reduce the number of residual particles on wafers after they have been planarized.

One conventional method for reducing residual particles on planarized wafers is to wash the wafers. Additionally, the wafer carrier and the pedestal are also typically washed between planarizing individual wafers. However, even after washing the wafers, pedestal, and wafer carrier, a significant number of residual particles are often present of the front face of the wafers. Merely washing the wafers and the CMP machine, therefore, is not sufficient to adequately reduce the number of residual particles on the wafers. Thus, it would be desirable to develop an apparatus and method that works with conventional washing equipment to further reduce the number of residual particles on planarized wafers.

SUMMARY OF THE INVENTION

The present invention is a planarizing machine and a method for reducing the number of residual particles on wafers or other substrates after CMP processing. In one embodiment, the planarizing machine has a platen mounted to a support structure, a polishing pad positioned on the platen, and a wafer carrier with a chuck. The polishing pad has a planarizing surface facing away from the platen, and the wafer carrier assembly is adapted to hold the backside of the wafer or other substrate in the chuck and engage the front face of the wafer with the planarizing surface of the polishing pad. The planarizing machine also has a wafer loading assembly with a pedestal upon which the wafer is placed to load and unload the wafer to the chuck. The pedestal is preferably connected to an actuator that raises and lowers the pedestal with respect to the wafer carrier assembly. A particle barrier film is positioned on the pedestal to engage the front face of the wafer. The particle barrier film is preferably a substantially non-porous film that does not entrap residual particles. Thus, substantially all of the residual particles are readily removed from the particle barrier film by a wash fluid to reduce the number of residual particles on surfaces of the CMP machine.

In a preferred embodiment, the particle barrier film has a top surface that supports residual particles in a manner that exposes side portions of residual particles to a stream of wash fluid. More particularly, the particle barrier film preferably supports only a lowermost portion of each waste particle so that even the lower portions of the waste particles may be impinged by a wash fluid stream and swept from the particle barrier film.

DETAILED DESCRIPTION OF THE INVENTION

Figure 1:
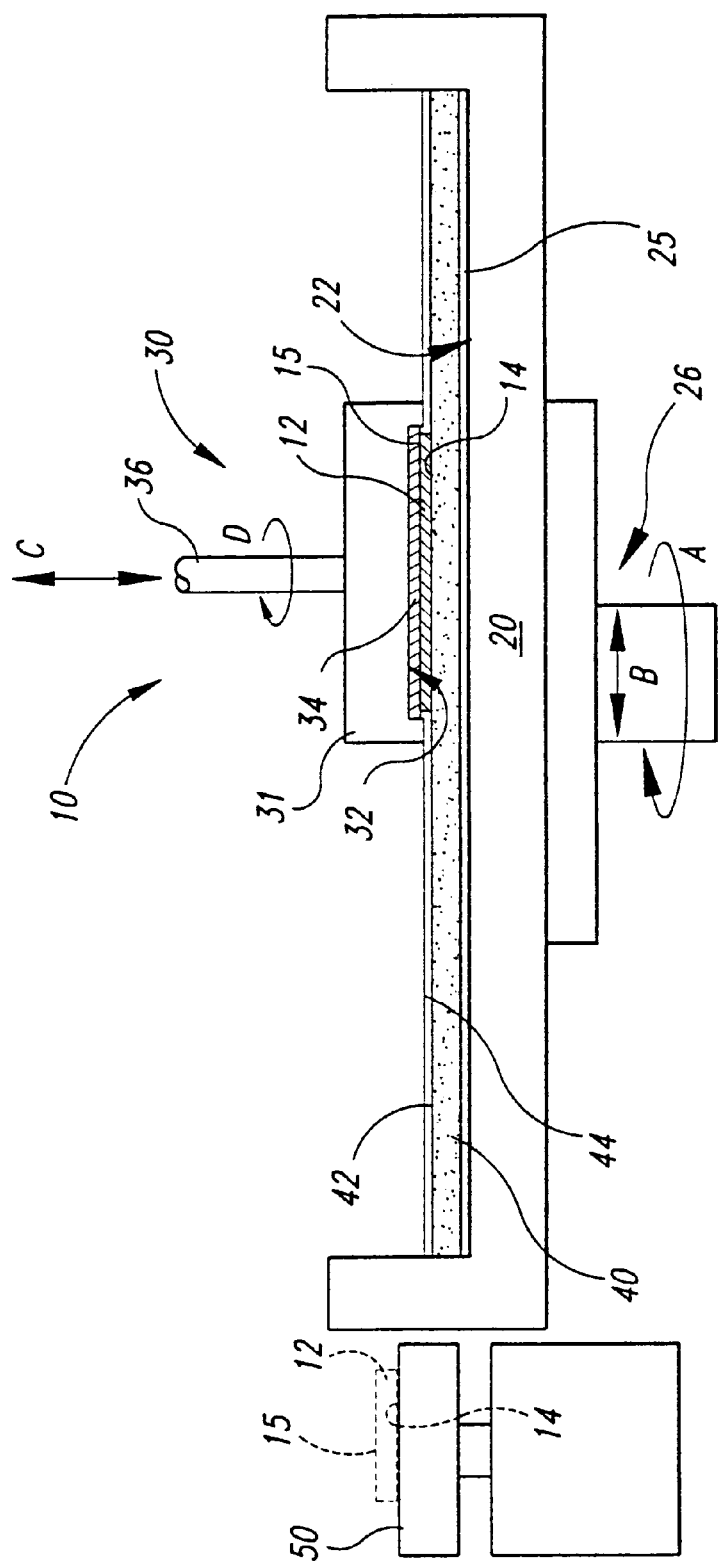
FIG. 1 is a schematic cross-sectional view of a chemical-mechanical planarizing machine in accordance with the prior art.
Figure 2:
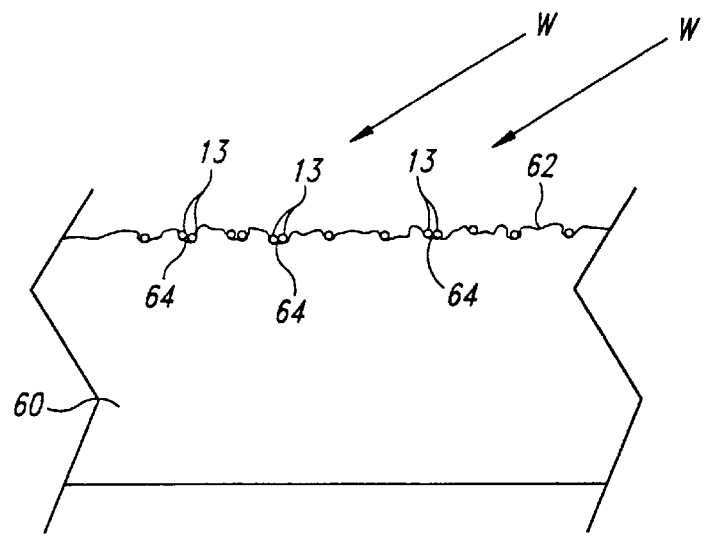
FIG. 2 is a conventional film used in a chemical-mechanical planarization machine of the prior art.

The present invention is a method and apparatus that reduces the number of residual particles on a wafer or other substrate after CMP processing. An important aspect of an embodiment of the invention is to cover surfaces of loading/ unloading pedestals with a particle barrier film from which residual particles are easily removed. A discovery of the present invention is that residual particles accumulate on conventional open-cell, porous films used to cover conventional wafer loading pedestals. For example, FIG. 2 illustrates a conventional open-cell film 60 with a top surface 62 that has a number of open pores 64 in which residual particles 13 accumulate. Several residual particles 13 are entrapped and at least partially protected from the force of a wash fluid W because only the top surfaces of the residual particles in the pores 64 are exposed to the wash W. Thus, after a period of time, a significant number of residual particles accumulate on conventional films even though they are washed after each wafer.

Figure 4:
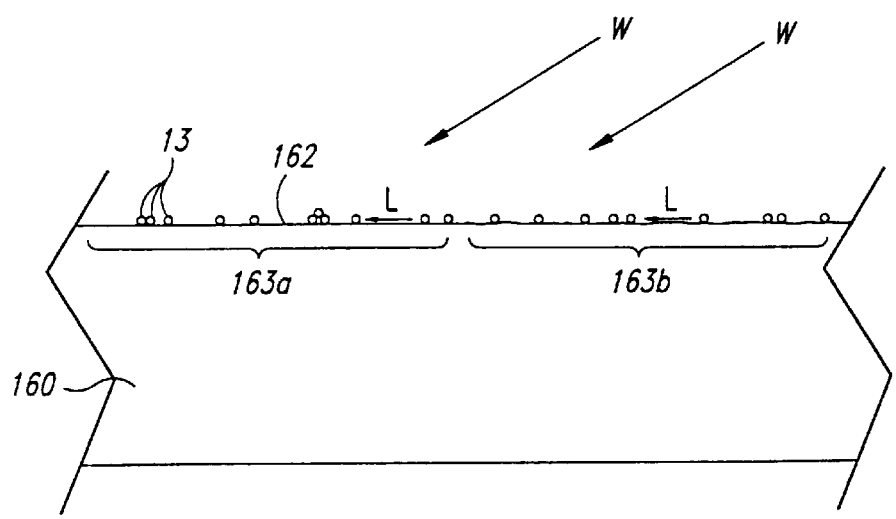
FIG. 4 is a partial cross-sectional view of a particle barrier film used in a chemical-mechanical planarization machine in accordance with the invention.
Figure 3:
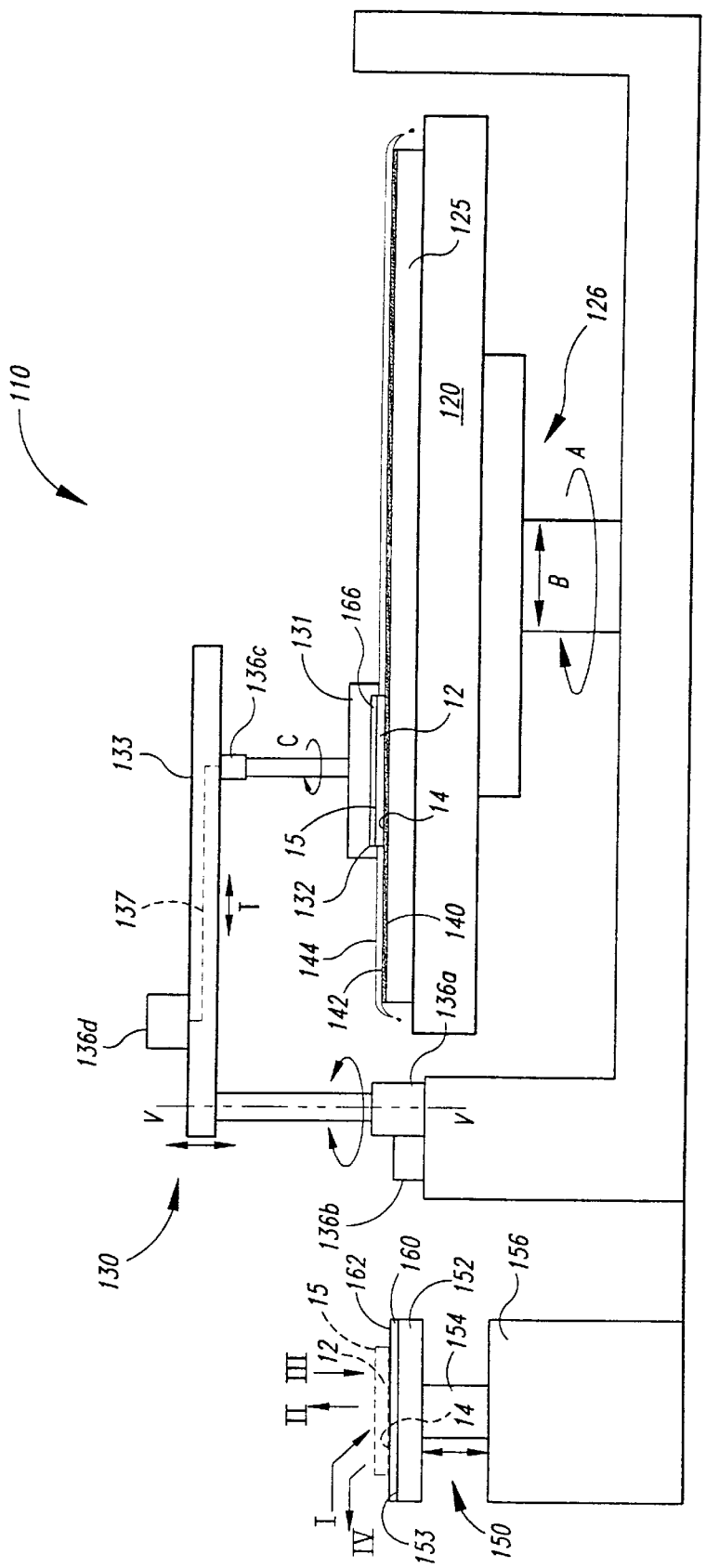
FIG. 3 is a chemical-mechanical planarization machine in accordance with the invention.

Unlike conventional open-cell films, the particle barrier films in accordance with the invention do not entrap the particles, but rather they provide a surface that exposes the sides and lower portions of residual particles to a stream of wash fluid. Thus, the lateral and upward forces of the wash fluid stream can act on the residual particles to remove substantially all of the particles from the particle barrier. Fewer particles, therefore, are available to attach themselves to the front face of the wafer. FIGS. 3 and 4, in which like references numbers refer to like parts throughout the figures, illustrate an embodiment of a CMP machine and a particle barrier film in accordance with the invention.

FIG. 3 illustrates a CMP machine 110 that reduces accumulations of residual particles to reduce the number of defects on a front face 14 of the wafer 12. The CMP machine 110 has a platen 120 moved by an actuator 126, an underpad 125 mounted to the top surface of the platen 120, and a polishing pad 140 mounted to the top surface of the underpad 125.

The CMP machine 110 also has a wafer carrier assembly 130 positionable over the polishing pad 140 to engage the front face 14 of the wafer 12 with the planarizing surface 142 of the polishing pad 140 in the presence of a planarizing solution 144. The wafer carrier assembly 130 preferably has a chuck 131 attached to an arm 133, and a number of cylinders and motors 136(a)–136(d) connected to the chuck 131 and the arm 133. A cylinder 136(a) may be attached to one end of the arm 133 to move the arm 133 vertically along an axis V—V with respect to the polishing pad 140, and a motor 136(b) may be connected to the cylinder 136(a) to rotate the cylinder 136(a) and the arm 133 about the axis V—V. Additionally, another motor 136(c) is preferably connected to the chuck 131 to rotate the chuck 131 in the direction of arrow C, and another actuator 136(d) is preferably operatively coupled to the chuck 131 by a connector 137. The actuator 136(d) and the connector 137 translate the chuck 131 along the longitudinal axis of the arm 133 (shown by arrow T).

The planarizing machine 110 also includes a wafer loading/unloading assembly 150 positioned proximate to the wafer carrier assembly 130. The loading/unloading assembly 150 has a pedestal 152 upon which the front face 14 of the wafer 12 is positioned in a loading/unloading position. The pedestal 152 is preferably attached to a rod 154 of an actuator 156, which moves the pedestal 152 upwardly and downwardly with respect to the wafer carrier assembly 130. As discussed in further detail below, the pedestal 152 is raised to attach the wafer 12 to the chuck 131 and lowered to remove the wafer 12 from the chuck 131.

A particle barrier 160 is positioned on the top surface 153 of the pedestal 152. Referring to FIGS. 3 and 4 together, the particle barrier 160 is preferably a film with a top surface 162 that does not entrap residual particles 13. The topography of the top surface 162 preferably supports the residual particles 13 so that the sides and lower portions of the residual particles 13 are exposed to the force of a stream of wash fluid W. The topography of the top surface 162, therefore, is preferably a smooth surface 163(a), but it may also be a slightly rough surface 163(b) with small features that support a substantial portion of each residual particle 13 above the high points on the top surface 162. The topography of the particle barrier film 160 is preferably substantially devoid of pores or depressions in which the residual particles 13 may become entrapped.

The particle barrier film 160 is preferably made from a substantially non-porous, closed-cell foam. One suitable closed-cell foam is a polyurethane film WB-20 manufactured by Rodell Corporation of Newark, Del. It is also expected that Mylar® and FR4® films may be suitable particle barrier films. Although the Rodell WB-20 closed-cell foam is commercially available, it has only been used to provide a resilient, compressible medium positioned either between the polishing pad and the platen, or the backside of the wafer and the chuck of the wafer carrier. Prior to the present invention, it has not been known that particles accumulate on the open-cell foam conventionally used on loading/unloading pedestals. Moreover, it is further believed that it has not been known that the WB-20 film reduces accumulations of particles on the loading/unloading pedestals.

FIG. 3 also illustrates the operation of the CMP machine 110. A robot or other device (not shown) places a wafer 12 on the top surface 162 of the particle barrier film 160 (step I). The wafer carrier assembly 130 then moves the chuck 131 over the pedestal 152, and either the chuck 131 is lowered or the pedestal 152 is raised to position the wafer 12 in the mounting cavity 132 of the chuck 131. The chuck 131 then removes the wafer 12 from the pedestal 152 (step II) and engages the wafer 12 with the planarizing surface 142 of the polishing pad 140 to planarize the wafer 12. As the wafer 12 is being planarized, the top surface 162 of the particle barrier 160 may be washed with a wash fluid. After the wafer 12 is planarized, the wafer carrier assembly 130 moves the wafer 12 over the pedestal 152, and then either the chuck 131 is lowered or the pedestal 152 is raised to place the front face 14 of the wafer 12 on the top surface 162 of the particle barrier 160 (step III). The chuck 131 is then disengaged from the wafer 12, and the wafer 12 is removed from the particle barrier 160 (step IV). After the wafer 12 is removed from both the chuck 131 and the pedestal 152, the first particle barrier 160 is sprayed with a wash fluid to wash residual particles from the CMP machine 110. Suitable wash fluids that may be used in a method of the invention include deionized wafer, ammonium hydroxide, or an organic ammonium hydroxide compound such as tetramethyl ammonium hydroxide.

The CMP machine 110 advantageously reduces the number of defects on finished wafers after CMP processing by reducing the number of residual particles on the pedestal that may become attached to the front face of the wafer. One of the central aspects of the invention is to cover the pedestal with a particle barrier film that prevents residual particles from accumulating on the pedestal. In general, the particle barrier film is a non-porous material that does not entrap residual particles. As a result, more residual particles may be washed from the particle barrier films of the invention than conventional open-cell, porous films. In actual experiments, only sixty-four particles remained on an eight-inch wafer planarized on a CMP machine of the invention with a pedestal covered with WB-20 polyurethane film manufactured by Rodell Corporation. In contrast, 485 particles remained on an eight-inch wafer planarized on a CMP machine with a pedestal covered with conventional open-cell, porous film. Therefore, the present invention reduces the number of defective wafers and increases the yield of non-defective wafers.

From the foregoing it will be appreciated that, although specific embodiments of the invention have been described herein for purposes of illustration, various modifications may be made without deviating from the spirit and scope of the invention. Also, even though the various embodiments of the invention are generally described as being used for planarizing semiconductor wafers, it will be understood that they are equally applicable to planarizing other types of substrates (e.g., baseplates for field emission displays). Accordingly, the invention is not limited except as by the appended claims.

What is claimed is:

1. A substrate loading/unloading assembly for attaching a substrate to a substrate carrier of a chemical-mechanical planarization machine, comprising:

a pedestal having an upwardly facing mounting surface; and a particle barrier film positioned on the mounting surface to engage the substrate, the barrier film having a top surface substantially devoid of depressions in which residual particles may be protected from a wash fluid.

2. The substrate loading/unloading assembly of claim 1 wherein the barrier film comprises a closed-cell foam.

3. The substrate loading/unloading assembly of claim 2 wherein the closed-cell foam comprises closed-cell polyurethane.

4. The substrate loading/unloading assembly of claim 1, further comprising another barrier film positioned in the substrate carrier.

5. A mounting system for attaching a substrate to a substrate carrier of a chemical-mechanical planarization machine, comprising:

a pedestal having an upwardly facing mounting surface; and a particle barrier film positioned on the mounting surface to engage the substrate, the film having a top surface that supports residual particles in a manner that exposes side portions of the residual particles to a wash stream.

6. The mounting system of claim 5 wherein the barrier film comprises a closed-cell foam.

7. The mounting system of claim 6 wherein the closed-cell foam comprises closed-cell polyurethane.

8. The mounting system of claim 6, further comprising another barrier film positioned in the substrate carrier.

9. A substrate loading/unloading pedestal for attaching a substrate to a substrate carrier of a chemical-mechanical planarization machine, comprising:

a platform having a mounting surface; and a particle barrier film positioned on the mounting surface, the barrier film having a surface with a topography upon which residual particles reside so that a substantial portion of each residual particle is elevated above the topography of the top surface.

10. The substrate loading/unloading pedestal of claim 9 wherein the barrier film comprises a closed-cell foam.

11. The substrate loading/unloading pedestal of claim 10 wherein the closed-cell foam comprises closed-cell polyurethane.

12. The substrate loading/unloading pedestal of claim 9, further comprising another barrier film positioned in the substrate carrier.

* * * * *

UNITED STATES PATENT AND TRADEMARK OFFICE
CERTIFICATE OF CORRECTION

PATENT NO. : 6,054,015
DATED : February 5, 1998
INVENTOR(S) : Thad Brunelli, Gina Garrison and Wade Van Buren It is certified that error appears in the above-identified patent and that said Letters Patent is hereby corrected as shown below:

Title page,
Insert, Related Application Data [63]
-- Division of application No. 08/741,818, Oct. 31, 1996, Pat. No. 5,702,292 --

U.S. Patent Documents [56]
"5,830,806 Hudson et al. ...   451/41  X" should be
-- 5,830,806 Hudson et al. ....  451/41 XR --

Signed and Sealed this

Sixteenth Day of October, 2001

Attest:

NICHOLAS P. GODICI
Attesting Officer    Acting Director of the United States Patent and Trademark Office

UNITED STATES PATENT AND TRADEMARK OFFICE
CERTIFICATE OF CORRECTION

PATENT NO.  : 6,054,015
DATED       : April 25, 2000
INVENTOR(S) : Thad Brunelli, Gina Garrison and Wade Van Buren It is certified that error appears in the above-identified patent and that said Letters Patent is hereby corrected as shown below:

Title page,
Item [63], Related Application Priority Data,
-- Division of application No. 08/741,818, Oct. 31, 1996, Pat. No. 5,702,292 --

Item [56], U.S. PATENT DOCUMENTS,
"5,830,806 Hudson et al. ...  451/41  X" should be
-- 5,830,806 Hudson et al. ....  451/41 XR --

This certificate supersedes Certificate of Correction issued October 16, 2001.

Signed and Sealed this

Twelfth Day of March, 2002

JAMES E. ROGAN
*Director of the United States Patent and Trademark Office*

*Attest:*

*Attesting Officer*